(12) United States Patent
Chung et al.

(10) Patent No.: US 10,148,262 B1
(45) Date of Patent: Dec. 4, 2018

(54) PROCESSING CIRCUIT OF RESET SIGNAL

(71) Applicant: ELAN MICROELECTRONICS CORPORATION, HsinChu (TW)

(72) Inventors: Pin-Jung Chung, Taoyuan (TW); Tien-Wen Pao, Hsinchu County (TW); Nan-Jung Liu, Hsinchu County (TW)

(73) Assignee: ELAN MICROELECTRONICS CORPORATION, HsinChu (TW)

( * ) Notice: Subject to any disclaimer, the term of this patent is extended or adjusted under 35 U.S.C. 154(b) by 0 days.

(21) Appl. No.: 15/896,075

(22) Filed: Feb. 14, 2018

(30) Foreign Application Priority Data

Jul. 21, 2017 (TW) .............................. 106124466 A

(51) Int. Cl.
| | | |
|---|---|---|
| *G06F 1/24* | (2006.01) | |
| *H03K 17/22* | (2006.01) | |
| *H03K 17/693* | (2006.01) | |
| *H03K 17/567* | (2006.01) | |
| *H03K 17/74* | (2006.01) | |
| *H03K 17/30* | (2006.01) | |

(52) U.S. Cl.
CPC ............. *H03K 17/223* (2013.01); *G06F 1/24* (2013.01); *H03K 17/302* (2013.01); *H03K 17/567* (2013.01); *H03K 17/693* (2013.01); *H03K 17/74* (2013.01)

(58) Field of Classification Search
CPC .... H03K 17/223; H03K 17/302; H03K 17/74; H03K 17/693; H03K 17/567; G06F 1/24
See application file for complete search history.

(56) References Cited

U.S. PATENT DOCUMENTS

| | | |
|---|---|---|
| 5,303,390 A | 4/1994 | Little |
| 6,675,303 B1 | 1/2004 | Lam |
| 6,956,414 B2 | 10/2005 | Sweet |
| 7,038,506 B2 * | 5/2006 | Om .......................... G06F 1/08 327/145 |
| 7,069,048 B2 | 6/2006 | Keon |
| 7,119,570 B1 | 10/2006 | Chirania |
| 8,754,680 B2 | 6/2014 | Xiao |
| 9,018,803 B1 | 4/2015 | Elberbaum |
| 9,516,362 B2 | 12/2016 | Velasco |

FOREIGN PATENT DOCUMENTS

| | | |
|---|---|---|
| CN | 204190734 U | 3/2015 |
| TW | 200908576 | 2/2009 |
| WO | 2016/130766 A1 | 8/2016 |

OTHER PUBLICATIONS

Should reset signal be active high or low, https://forums.xilinx.com/t5/Synthesis/should-reset-signal-be-active-high-or-low/td-p/637236,Jun. 21, 2015.

* cited by examiner

*Primary Examiner* — Kenneth B Wells
(74) *Attorney, Agent, or Firm* — Winston Hsu

(57) ABSTRACT

A processing circuit of a reset signal is provided. The processing circuit receives the reset signal via a reset end. The processing circuit includes a multiplexer, an inverter and a switching unit. The multiplexer has an output end, a first input end and a second input end. The multiplexer is utilized for connecting the output end to the first input end or the second input end according to a selection signal. The inverter is coupled to the second input end of the multiplexer. The switching unit is coupled to the reset end for receiving the reset signal and connecting the reset end to the first input end of the multiplexer or the inverter according to the selection signal.

15 Claims, 14 Drawing Sheets

PROCESSING CIRCUIT OF RESET SIGNAL

BACKGROUND OF THE INVENTION

1. Field of the Invention

The present invention relates to a processing circuit of a reset signal, and more particularly, to a processing circuit of a reset signal capable of implementing active low reset and active high reset via single reset end.

2. Description of the Prior Art

An integrated circuit device performs a reset procedure after receiving a reset signal. Different customers may define different reset signals, so that the integrated circuit device requires external circuit components for processing the rest signals. For example, a reset procedure of an integrated circuit device is triggered by a reset signal that changes from high to low. If a customer A defines a reset signal that changes from low to high, the integrated circuit device needs external circuit components for processing the reset signal defined by the customer A. However, the additional external circuit components would increase cost and also affect reliability. Thus, the prior art has to be improved.

SUMMARY OF THE INVENTION

It is therefore an objective of the present invention to provide a processing circuit to be applied in an integrated circuit device for processing various reset signals without additional external circuit components, to solve the problems in the prior art.

The present invention discloses a processing circuit of a reset signal, the processing circuit receiving the reset signal via a reset end, the processing circuit comprising a multiplexer having an output end, a first input end and a second input end, for connecting the output end to the first input end or the second input end according to a selection signal; an inverter coupled to the second input end of the multiplexer; and a switching unit coupled to the reset end for receiving the reset signal and connecting the reset end to the first input end of the multiplexer or the inverter according to the selection signal.

These and other objectives of the present invention will no doubt become obvious to those of ordinary skill in the art after reading the following detailed description of the preferred embodiment that is illustrated in the various figures and drawings.

DETAILED DESCRIPTION

In an embodiment, a processing circuit of a reset signal of the present invention is disposed in an integrated circuit device 3. The integrated circuit device 3 can be a controller of a pointing device.

Figure 1:
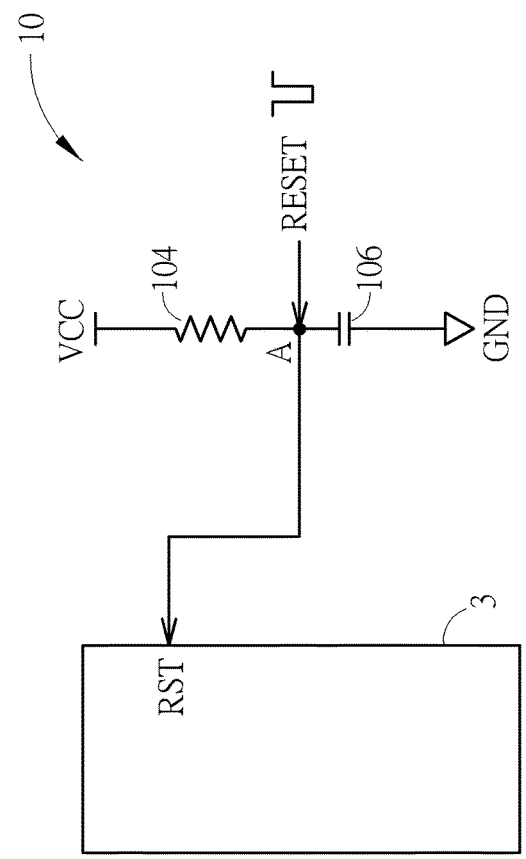
FIG. 1 is a schematic diagram illustrating that a processing circuit according to an embodiment of the present invention is capable of processing an active low reset signal.

FIG. 1 is a schematic diagram illustrating that a processing circuit according to an embodiment of the present invention is capable of processing an active low reset signal. An active low external reset signal RESET shown in FIG. 1 changes from a high level to a low level. As shown in FIG. 1, a reset procedure of the integrated circuit device 3 is triggered by the external reset signal RESET provided by an external device 10. The external device 10 includes a resistor 104 and a capacitor 106. The resistor 104 is in serial connected with the capacitor 106. A first end of the resistor 104 is connected to a voltage source VCC, and a second end of the resistor 104 is connected to the capacitor 106. A first end of the capacitor 106 is connected to the resistor 104, and a second end of the capacitor 106 is connected to ground. A point A is between the resistor 104 and the capacitor 106. The external reset signal RESET is transmitted to the integrated circuit device 3 via the point A. The point A is at a high voltage level (High) when the external device 10 is in operation. When the external device 10 transmits the external reset signal RESET to the integrated circuit device 3, the voltage level of the point A is pulled down to a low voltage level (Low). In response to the external reset signal RESET, the integrated circuit device 3 performs a reset procedure. The external device 10 can be an integrated circuit device and the other circuit components of the external device 10 are not shown in FIG. 1 for brevity.

Figure 2:
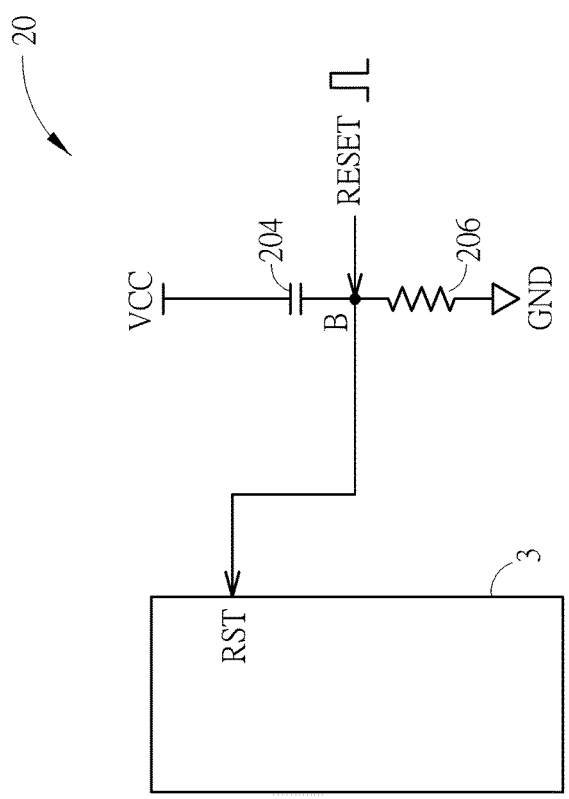
FIG. 2 is a schematic diagram illustrating that a processing circuit according to an embodiment of the present invention is capable of processing an active high reset signal.

FIG. 2 is a schematic diagram illustrating that the integrated circuit device 3 according to an embodiment of the present invention is capable of processing an active high reset signal. An active high external reset signal RESET shown in FIG. 2 changes from a low level to a high level. As shown in FIG. 2, a reset procedure of the integrated circuit device 3 is triggered by the external reset signal RESET provided by an external device 20. The external device 20 includes a capacitor 204 and a resistor 206. The capacitor 204 is in serial connected with the resistor 206. A first end of the capacitor 204 is connected to a voltage source VCC, and a second end of the capacitor 204 is connected to the resistor 206. A first end of the resistor 206 is connected to the capacitor 204, and a second end of the resistor 206 is connected to ground. A point B is between the capacitor 204 and the resistor 206. The external reset signal RESET is transmitted to the integrated circuit device 3 via the point B. The point B is at a low voltage level (Low) when the external device 20 is in operation. When the external device 20 transmits the external reset signal RESET to the integrated circuit device 3, the voltage level of the point B is pulled up to a high voltage level (High). In response to the external reset signal RESET, the integrated circuit device 3 performs a reset procedure. The external device 20 can be an integrated circuit device and the other circuit components of the external device 20 are not shown in FIG. 2 for brevity.

Figure 3:
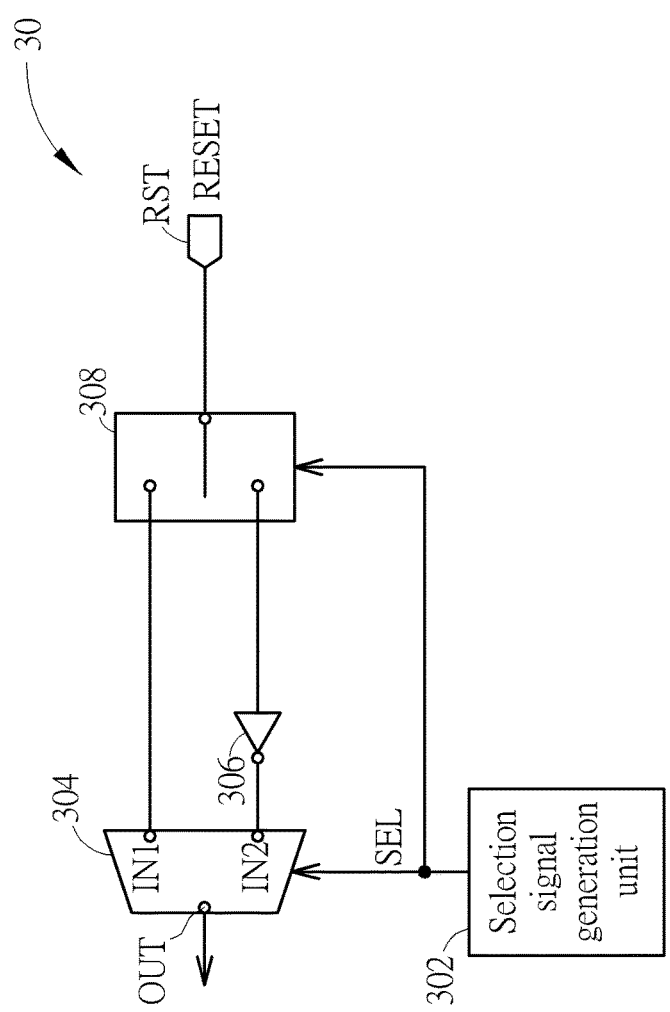
FIG. 3 is a schematic diagram illustrating a processing circuit according to an embodiment of the present invention.

FIG. 3 is a schematic diagram illustrating a processing circuit 30 according to an embodiment of the present invention. The processing circuit 30 is disposed in the integrated circuit device 3. The processing circuit 30 includes a selection signal generation unit 302, a multiplexer 304, an inverter 306 and a switching unit 308. The reset end RST can be a reset pin of an integrated circuit device for receiving the external reset signal RESET. The selection signal generation unit 302 is utilized for generating a selection signal SEL. The multiplexer 304 includes an output end OUT, a first input end IN1 and a second input end IN2. The multiplexer 304 connects the output end OUT to the first input end IN1 or the second input end IN2 according to the selection signal SEL. An input end of the inverter 306 is coupled to the switching unit 308, and an output end of the inverter 306 is coupled to the second input end IN2 of the multiplexer 304. The switching unit 308 is coupled to the reset end RST for receiving the external reset signal RESET and selectively connecting the reset end RST to the first input end IN1 of the multiplexer 304 or the input end of the inverter 306 according to the selection signal SEL. In an embodiment, the switching unit 308 can be a de-multiplexer, and this should not be a limitation of the present invention.

The selection signal generation unit 302 provides the selection signal SEL. In an embodiment, when the selection signal SEL is at a first level (e.g., a ground voltage Vgnd), the switching unit 308 connects the reset end RST to the first input end IN1 of the multiplexer 304 according to the selection signal SEL, and the multiplexer 304 connects the output end OUT to the first input end IN1 according to the selection signal SEL. As such, the external reset signal RESET is transmitted to the output end OUT via the first input end IN1 of the multiplexer 304. When the selection signal SEL is at a second level (e.g., a voltage source VCC), the switching unit 308 connects the reset end RST to the input end of the inverter 306 according to the selection signal SEL, and the multiplexer 304 connects the output end OUT to the second input end IN2 according to the selection signal SEL. Under such a situation, the external reset signal RESET is transmitted to the input end of the inverter 306. The inverter 306 inverts the external reset signal RESET and outputs the inverted external reset signal RESET to the second input end IN2 of the multiplexer 304. The inverted external reset signal RESET is transmitted to the output end OUT by the multiplexer 304. In response to the reset signal outputted by the multiplexer 304, the integrated circuit device 3 performs a reset procedure.

Figure 4:
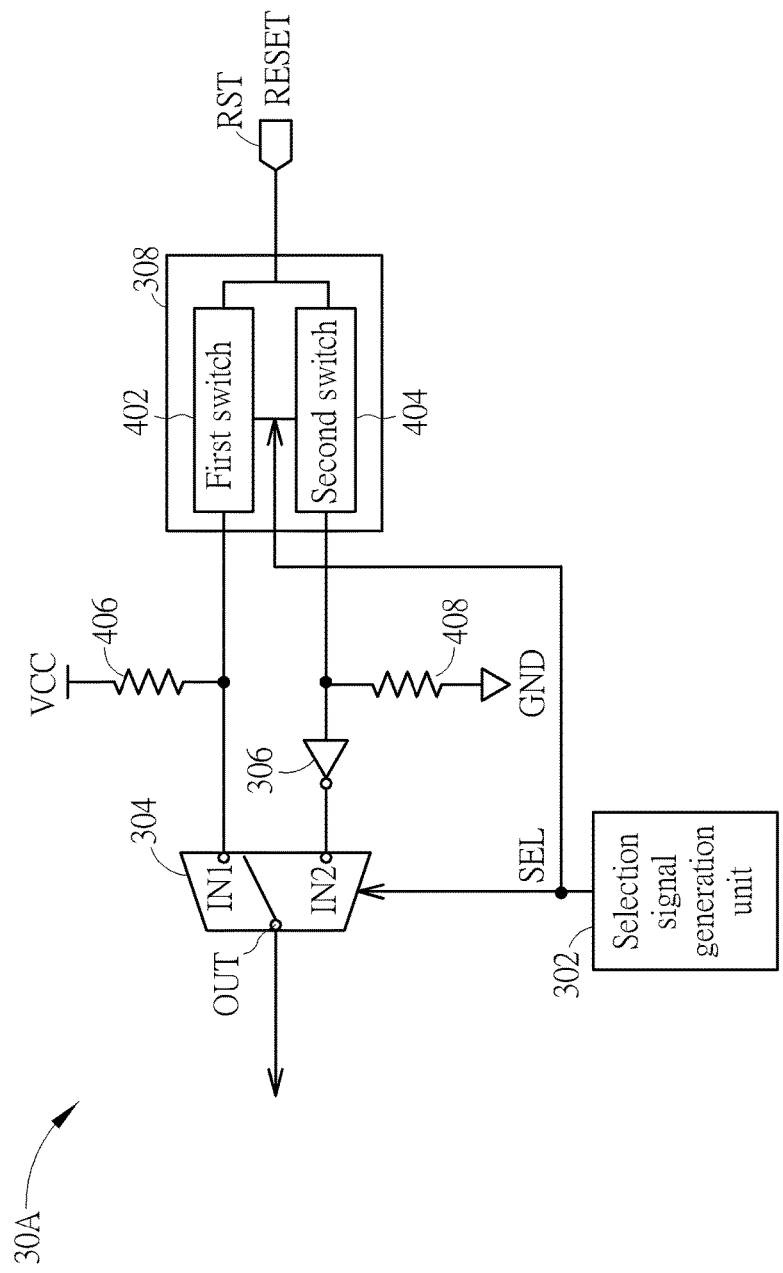
FIG. 4 and FIG. 5 are schematic diagrams illustrating the switching unit of FIG. 3 according to embodiments of the present invention.

In an embodiment, the switching unit 308 can be realized by two switches. For example, as shown in FIG. 4, the switching unit 308 includes a first switch 402 and a second switch 404. The first switch 402 is coupled between the reset end RST and the first input end IN1 of the multiplexer 304 and is utilized for selectively establishing an electrical connection between the reset end RST and the first input end IN1 of the multiplexer 304 according to the selection signal SEL. The first switch 402 can be a complementary metal oxide semiconductor (CMOS) transmission gate or an n-type metal oxide semiconductor (NMOS) transistor, and those should not be a limitation of the present invention. The second switch 404 is coupled between the reset end RST and the input end of the inverter 306 and is utilized for selectively establishing an electrical connection between the reset end RST and the input end of the inverter 306 according to the selection signal SEL. The second switch 404 can be a CMOS transmission gate or a p-type metal oxide semiconductor (PMOS) transistor, and those should not be a limitation of the present invention.

In an embodiment shown in FIG. 4, the processing circuit 30A further includes resistors 406 and 408. A first end of the resistor 406 is coupled to a voltage source VCC and a second end of the resistor 406 is coupled to the first switch 402 and the first input end IN1 of the multiplexer 304. When the first switch 402 is turned off, the first input end IN1 of the multiplexer 304 can be maintained at a high voltage level (e.g., the voltage source VCC), to prevent the first input end IN1 of the multiplexer 304 from floating. A first end of the resistor 408 is coupled to the input end of the inverter 306 and the second switch 404, and a second end of the resistor 408 is coupled to a ground end GND. When the second switch 404 is turned off, the input end of the inverter 306 can be maintained at a low voltage level (e.g., the ground voltage Vgnd of the ground end GND) to prevent the input end of the inverter 306 from floating.

Figure 5:
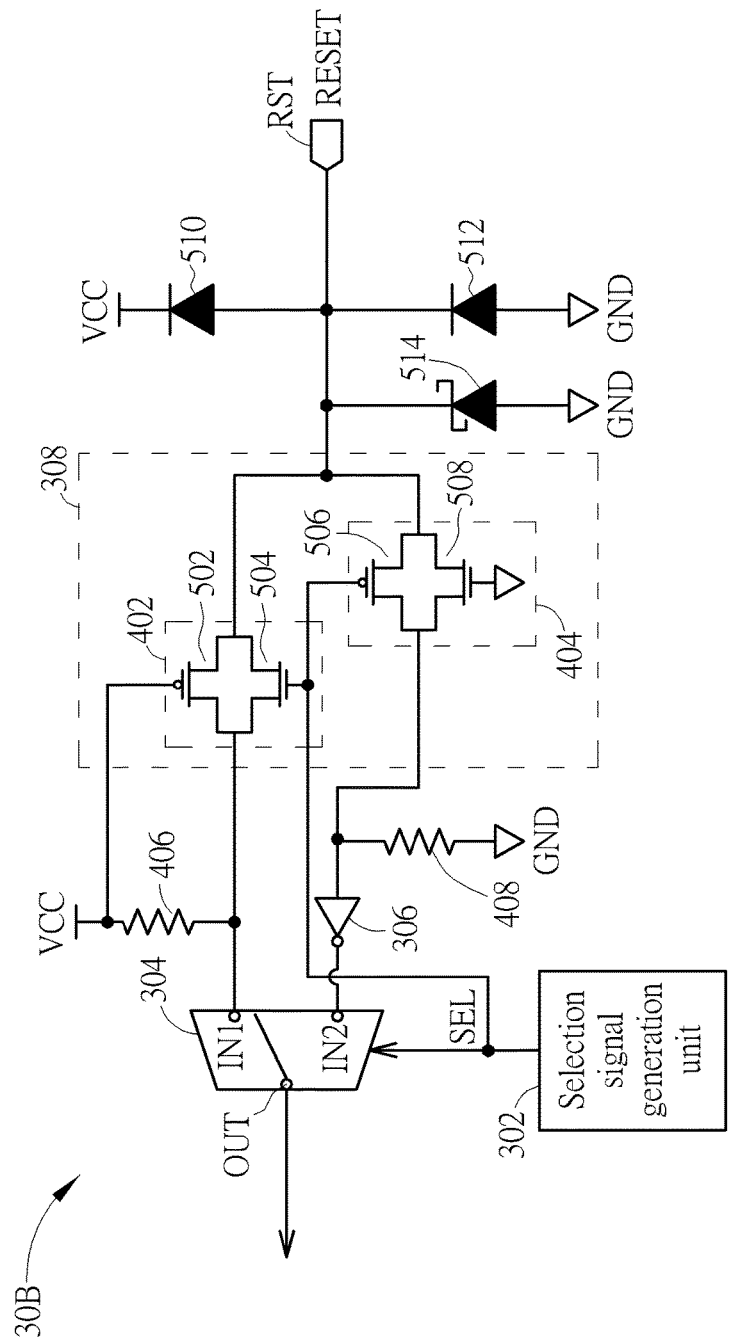

FIG. 5 is substantially similar to FIG. 4. FIG. 5 is a schematic diagram illustrating the first switch 402 and the second switch 404 of FIG. 4 according to an embodiment of the present invention. In an embodiment shown in FIG. 5, the first switch 402 includes transistors 502 and 504. The transistors 502 and 504 form a transmission gate. The transistor 502 can be a PMOS transistor. The transistor 504 can be an NMOS transistor. The drain of the transistor 502 is coupled to the reset end RST, the gate of the transistor 502 is coupled to the voltage source VCC, and the source of the transistor 502 is coupled to the first input end IN1 of the multiplexer 304. The drain of the transistor 504 is coupled to the reset end RST, the gate of the transistor 504 is coupled to the selection signal generation unit 302 for receiving the selection signal SEL, and the source of the transistor 504 is coupled to the first input end IN1 of the multiplexer 304. The second switch 404 includes transistors 506 and 508. The transistors 506 and 508 form a transmission gate. The transistor 506 can be a PMOS transistor. The transistor 508 can be an NMOS transistor. The drain of the transistor 506 is coupled to the reset end RST, the gate of the transistor 506 is coupled to the selection signal generation unit 302 for receiving the selection signal SEL, and the source of the transistor 506 is coupled to the input end of the inverter 306. The drain of the transistor 508 is coupled to the reset end RST, the gate of the transistor 508 is coupled to the ground end GND, and the source of the transistor 508 is coupled to the input end of the inverter 306. When the selection signal SEL is at a high voltage level, the transistor 504 is turned on and the multiplexer 304 connects the output end OUT to the first input end IN1. When the selection signal SEL is at a low voltage level, the transistor 506 is turned on and the multiplexer 304 connects the output end OUT to the second input end IN2.

The processing circuit 30B further includes diodes 510 and 512. As shown in FIG. 5, the cathode of the diode 510 is coupled to a voltage source VCC, and the anode of the diode 510 is coupled to the reset end RST. The cathode of the diode 512 is coupled to the reset end RST, and the anode of the diode 512 is coupled to the ground end GND. The combination of the diodes 510 and 512 can provide an electrostatic discharge (ESD) protection to protect the components of the processing circuit 30B from damage. The processing circuit 30B further includes a Schottky diode 514 for preventing the processing circuit 30B from being damaged by the negative voltage inputted via the reset end RST. As shown in FIG. 5, the cathode of the Schottky diode 514 is coupled to the reset end RST, and the anode of the Schottky diode 514 is coupled to the ground end GND.

Figure 6:
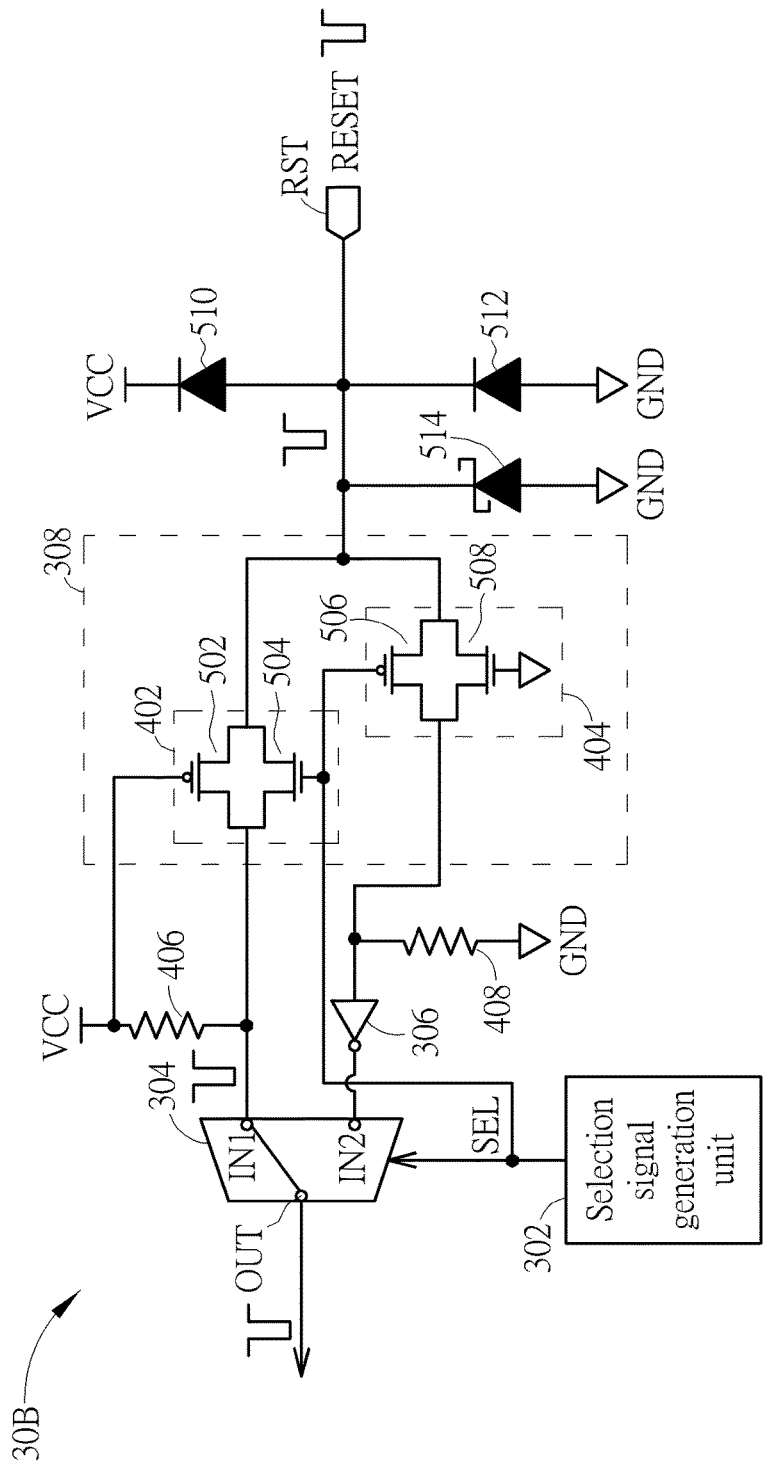
FIG. 6 is a schematic diagram illustrating operations of a processing circuit according to an embodiment of the present invention when receiving an active low reset signal.

As shown in FIG. 6, if the external reset signal RESET is an active low reset signal, the selection signal SEL is at a high voltage level, the transistor 504 is turned on and the transistor 506 is turned off, so that the external reset signal RESET is transmitted to the first input end IN1 of the multiplexer 304 via the transistor 504. The multiplexer 304 connects the output end OUT to the first end IN1 according to the selection signal SEL, so that the external reset signal RESET is outputted from the output end OUT of the multiplexer 304. In response to the reset signal outputted by the multiplexer 304, the integrated circuit device applying the processing circuit 30B performs a reset procedure.

Figure 7:
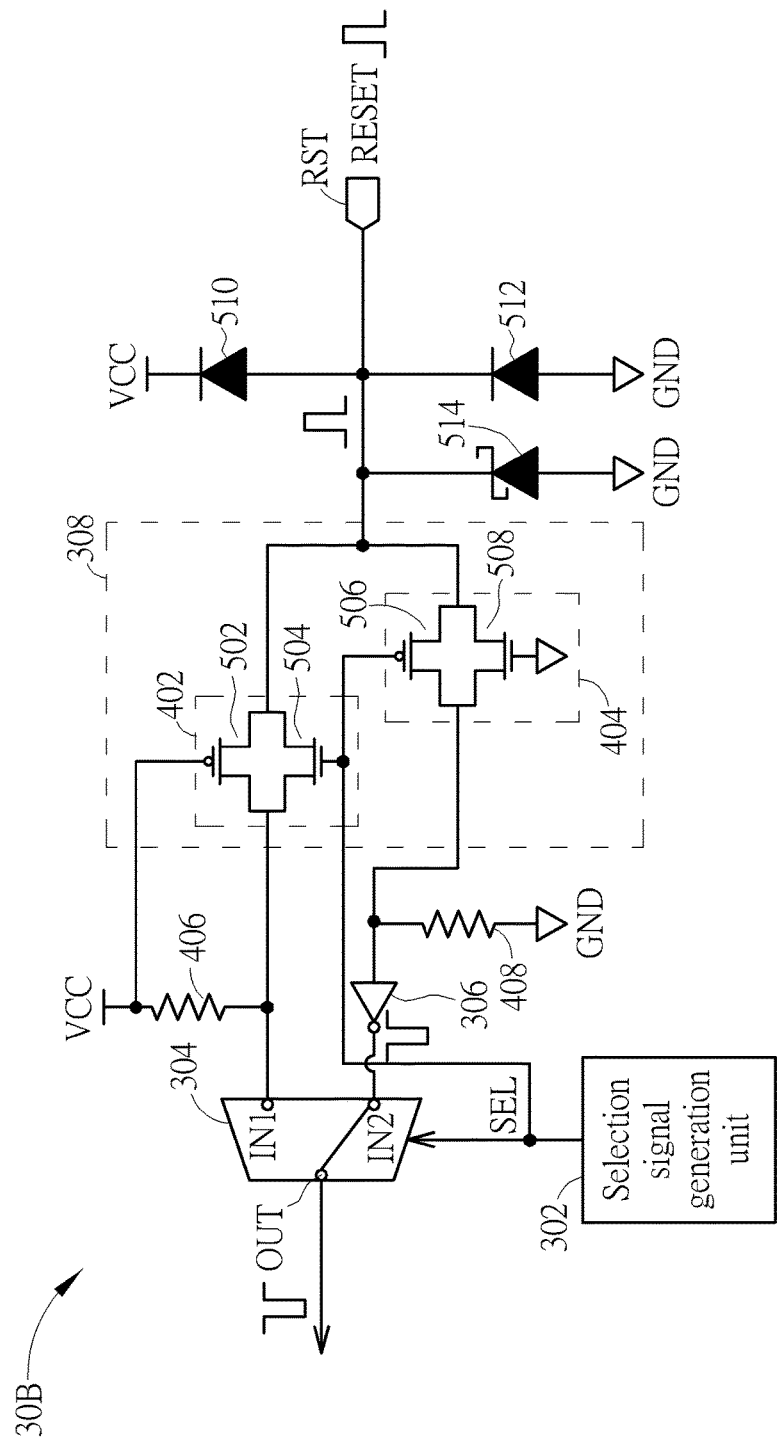
FIG. 7 is a schematic diagram illustrating operations of a processing circuit according to an embodiment of the present invention when receiving an active high reset signal.

As shown in FIG. 7, if the external reset signal RESET is an active high reset signal, the selection signal SEL is at a low voltage level, the transistor 506 is turned on and the transistor 504 is turned off, so that the external reset signal RESET is transmitted to the input end of the inverter 306 via the transistor 506. The inverter 306 inverts the external reset signal RESET and outputs the inverted external reset signal RESET to the second input end IN2 of the multiplexer 304. The multiplexer 304 connects the output end OUT to the second end IN2 according to the selection signal SEL, so that the inverted external reset signal RESET is outputted from the output end OUT of the multiplexer 304. As shown in FIG. 7, the output signal of the multiplexer 304 is an inverted signal of the external reset signal RESET. In response to the reset signal outputted by the multiplexer 304, the integrated circuit device applying the processing circuit 30B performs a reset procedure.

Figure 8:
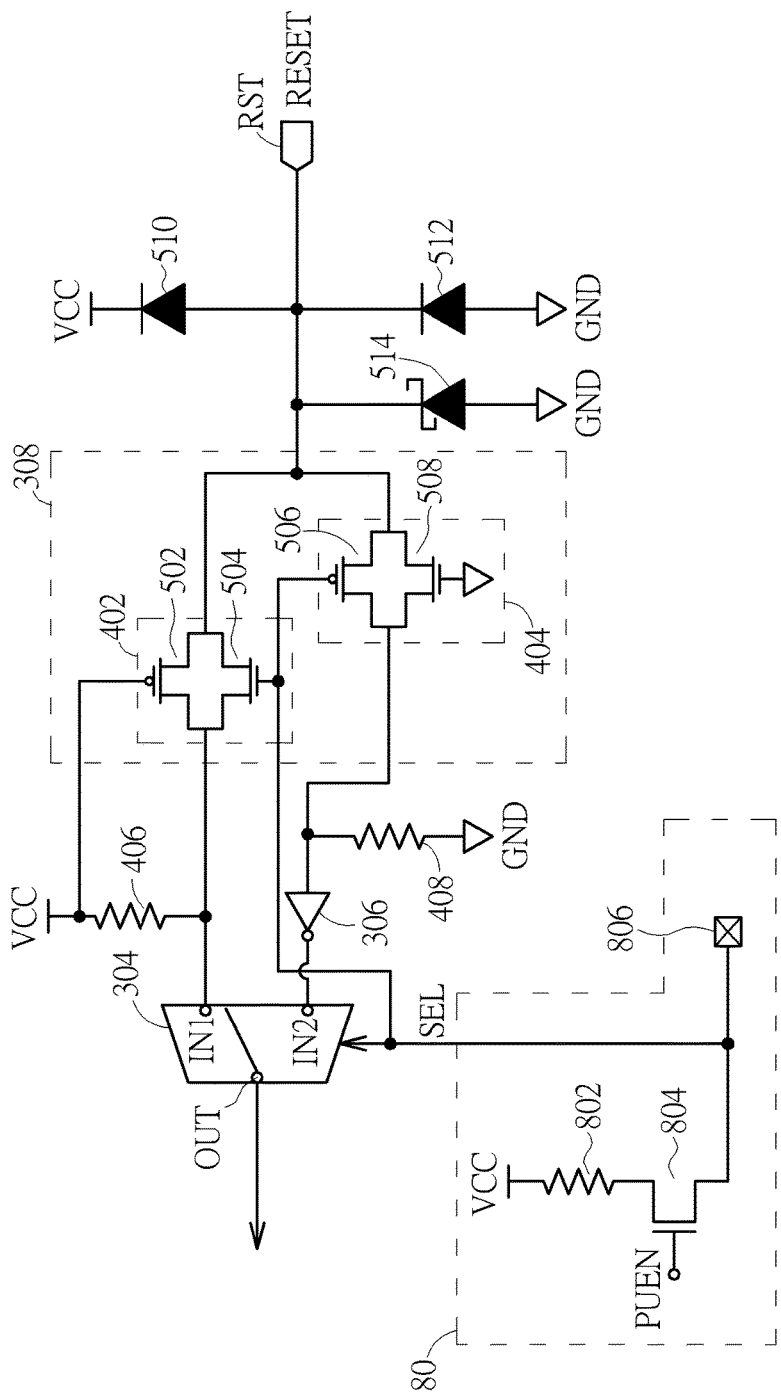
FIG. 8 to FIG. 11 are schematic diagrams illustrating alternative embodiments of the selection signal generation unit shown in FIG. 3.

FIG. 8 to FIG. 11 illustrate exemplary embodiments of the selection signal generation unit according to alternative embodiments of the present invention. Please refer to FIG. 8. A selection signal generation unit 80 includes a resistor 802, a transistor 804 and a pad 806. A first end of the resistor 802 is coupled to the voltage source VCC, and a second end of the resistor 802 is coupled to the drain of the transistor 804. The gate of the transistor 804 is utilized for receiving a control signal PUEN to turn the transistor 804 on or off. The source of the transistor 804 is utilized for providing the selection signal SEL and is coupled to the multiplexer 304, the switching unit 308 and the bonding pad 806. As shown in FIG. 8, the multiplexer 304 is connected to the bonding pad 806. The bonding pad 806 is connected to the ground end GND or floating, so as to determine the voltage level of the selection signal SEL. For example, if the bonding pad 806 of the selection signal generation unit 80 is floating and the transistor 804 is turned on according to the control signal PUEN, the selection signal SEL is at a high voltage level. If the bonding pad 806 of the selection signal generation unit 80 is connected to the ground end GND, the selection signal SEL is at a low voltage level. The bonding pad 806 can be connected to the ground end GND via a wire. Besides, when the bonding pad 806 is connected to the ground, the transistor 804 can be turned off by the control signal PUEN for power saving.

Figure 9:
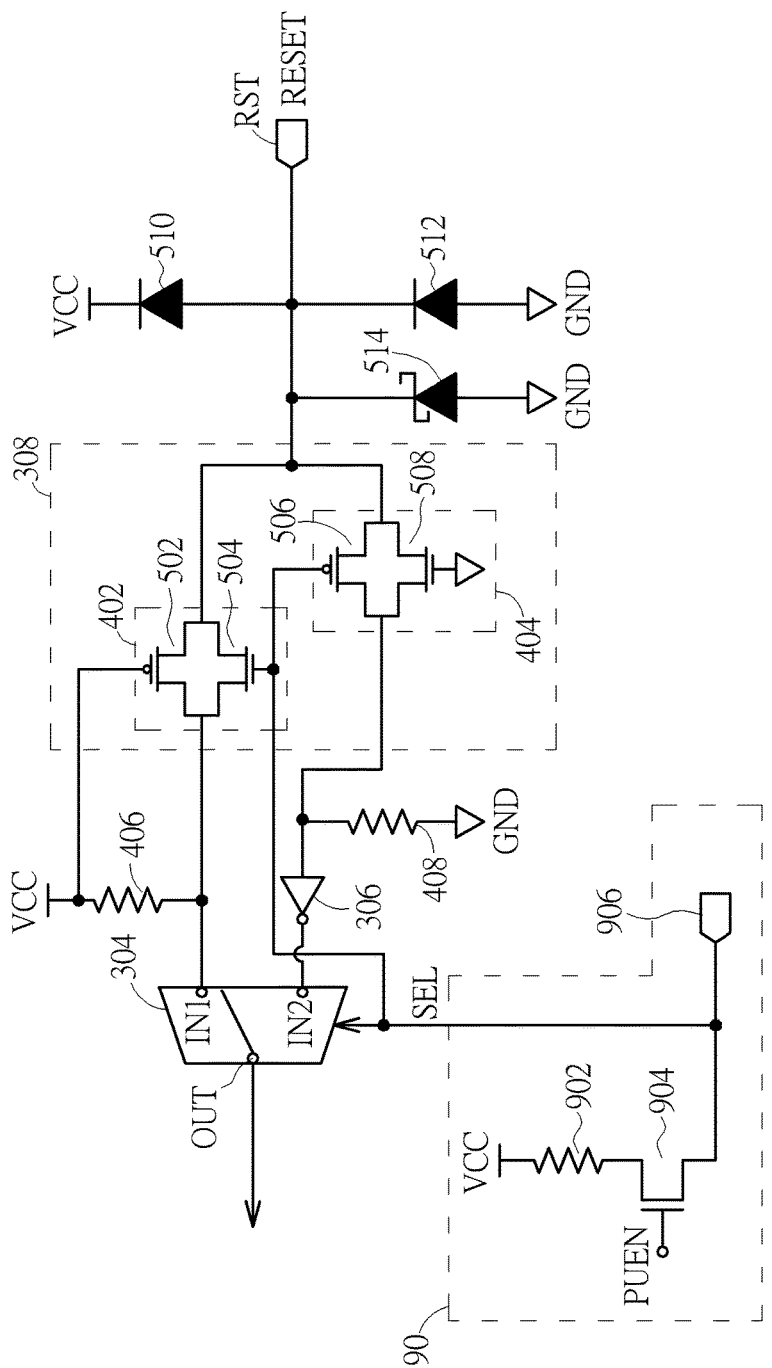

In an embodiment shown in FIG. 9, a selection signal generation unit 90 includes a resistor 902, a transistor 904 and a pin 906. A first end of the resistor 902 is coupled to the voltage source VCC, and a second end of the resistor 902 is coupled to the drain of the transistor 904. The gate of the transistor 904 is utilized for receiving a control signal PUEN to turn the transistor 904 on or off. The source of the transistor 904 is utilized for providing the selection signal SEL and is coupled to the multiplexer 304, the switching unit 308 and the pin 906. As shown in FIG. 9, the multiplexer 304 is connected to the pin 906. The pin 906 is connected to the ground end GND or floating, so as to determine the voltage level of the selection signal SEL. For example, if the pin 906 of the selection signal generation unit 90 is floating and the transistor 904 is turned on by the control signal PUEN, the selection signal SEL is at a high voltage level. If the pin 906 is connected to the ground end GND, the selection signal SEL is at a low voltage level. Similarly, when the pin 906 is connected to the ground, the transistor 904 can be turned off by the control signal PUEN for power saving.

Each of the pad 806 shown in FIG. 8 and the pin 906 shown in FIG. 9 is an electrical contact, and the electrical contact is floating or is connected to the ground end GND to determine the voltage level of the selection signal SEL.

Figure 10:
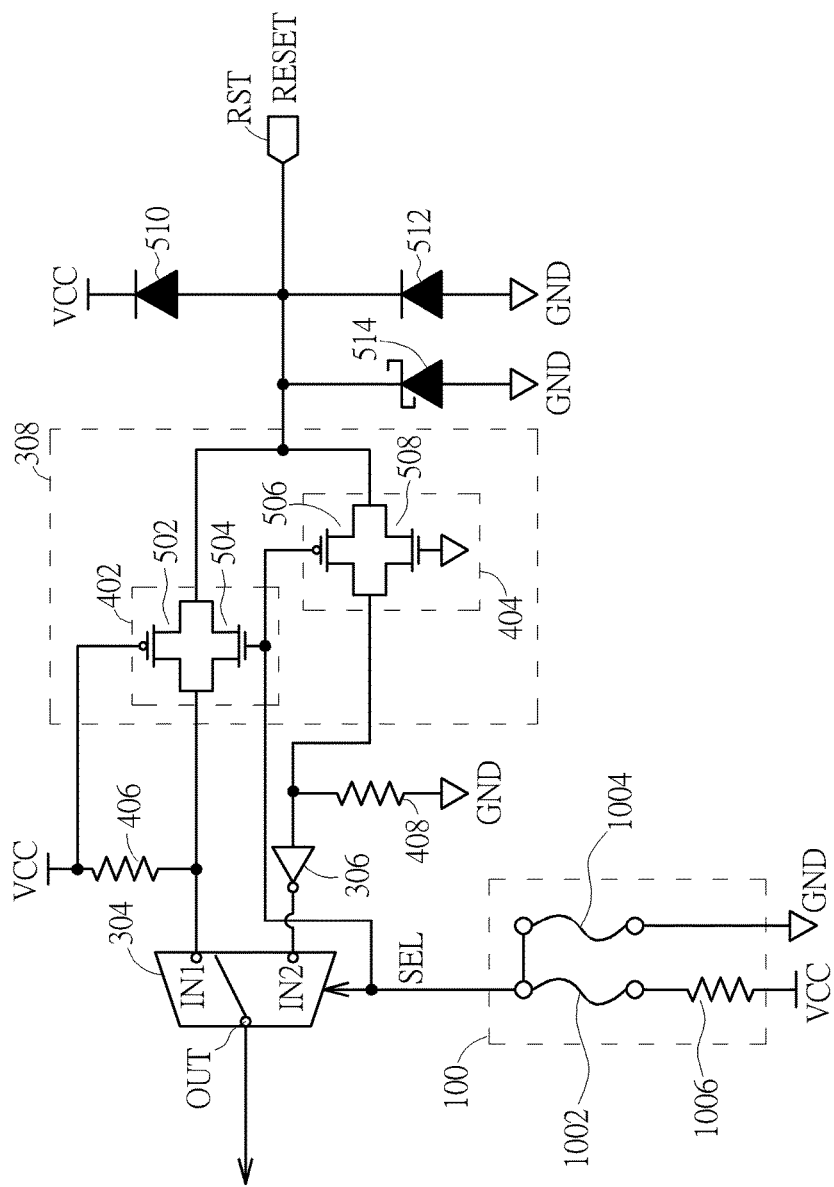

In an embodiment shown in FIG. 10, a selection signal generation unit 100 includes fuses 1002 and 1004, and a resistor 1006. The fuse 1002 is connected between the multiplexer 304 and a first end of the resistor 1006. A second end of the resistor 1006 is connected to the voltage source VCC. The fuse 1004 is connected between the multiplexer 304 and the ground GND. One of the fuses 1002 and 1004 is disconnected. If the fuse 1004 is disconnected and the fuse 1004 is connected to the resistor 1006, the selection signal SEL is at a high voltage level. If the fuse 1002 is disconnected and the fuse 1004 is connected to the ground GND, the selection signal SEL is at a low voltage level. In an embodiment shown in FIG. 10, the selection signal generation unit 100 can be understood to include a resistor 1006 connected to the voltage source VCC and a fuse. A first end of the fuse is for providing the selection signal SEL and is connected to the multiplexer 304 and the switching unit 308. A second end of the fuse is selectively connected to the resistor 1006 or the ground GND.

Through communication with the customer, it can be known in advance whether the external reset signal RESET is an active low reset signal or an active high reset signal. Accordingly, it is determined whether the selection signal generation units shown in FIG. 8 to FIG. 11 provide a high voltage level selection signal or a low voltage level selection signal to the multiplexer 304 and the switching unit 308.

In an alternative embodiment, it can be known whether the external reset signal RESET provided by the external device is an active low reset signal or an active high reset signal by detection means. Please refer to FIG. 11. A selection signal generation unit 110 includes a voltage detection component 1102. The voltage detection component 1102 is coupled to the reset end RST, the multiplexer 304 and the switching unit 308 and is utilized for detecting a voltage level of the reset end RST at a predetermined time point after the integrated circuit device including the processing circuit 30C is powered on, and accordingly generating the selection signal SEL.

Figure 11:
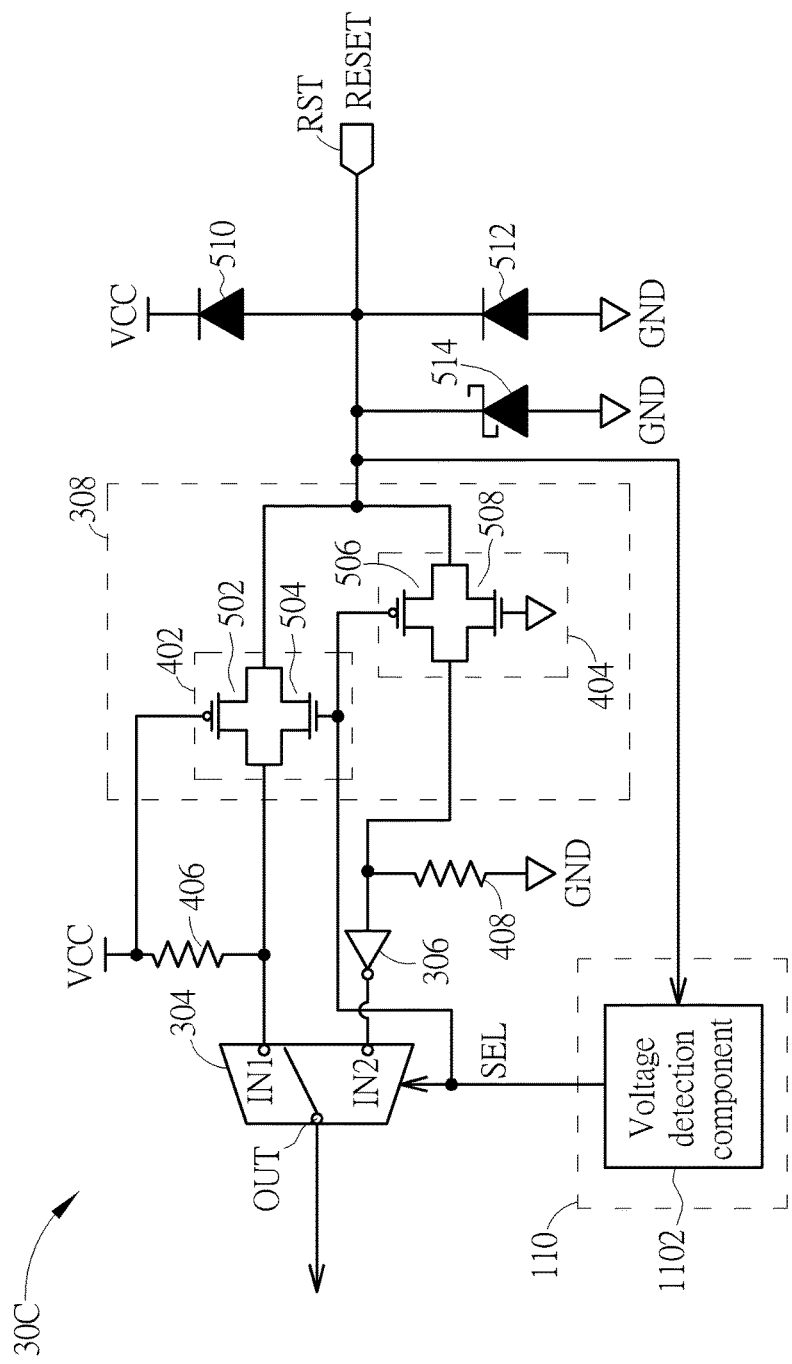
Figure 12:
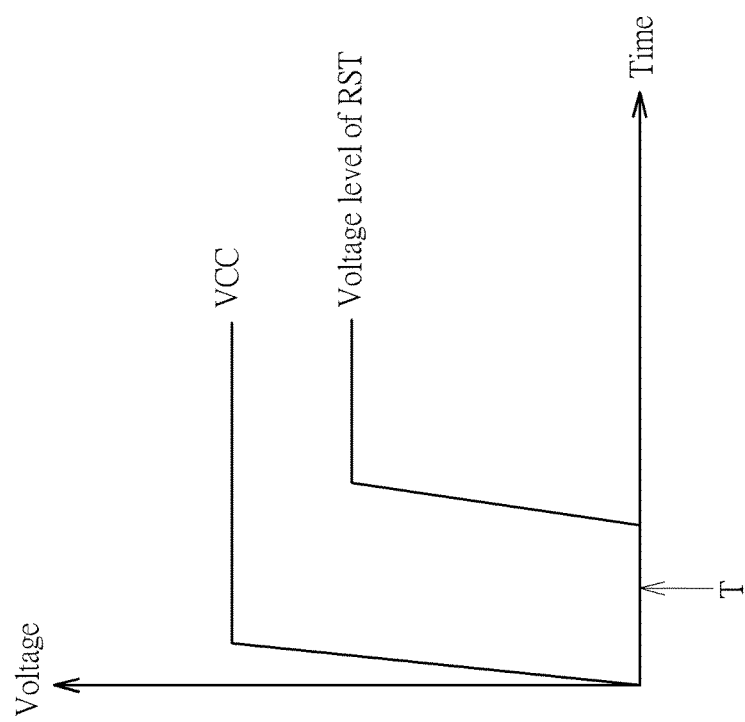
FIG. 12 and FIG. 13 are schematic diagrams illustrating voltage level variation of the voltage source and the reset end according to embodiments of the present invention.

The structure of FIG. 11 can be applied to the external device 10 shown in FIG. 1 or the external device 20 shown in FIG. 2. In an embodiment, the voltage source VCC of the integrated circuit device including the processing circuit 30C can be connected to the voltage source VCC of the external device 10. When the external device 10 is powered on, voltage variations of the voltage source VCC and the reset end RST can be shown in FIG. 12. At a predetermined time point T, the voltage detection component 1102 detects a low voltage at the reset end RST and accordingly generates the selection signal SEL with a low voltage level to the multiplexer 304 and the switching unit 308. As shown in FIG. 12, the voltage level of the reset end RST raises in response to the charging of the capacitor 106 and the predetermined time point T is set before the voltage level of the reset end RST raises.

Figure 13:
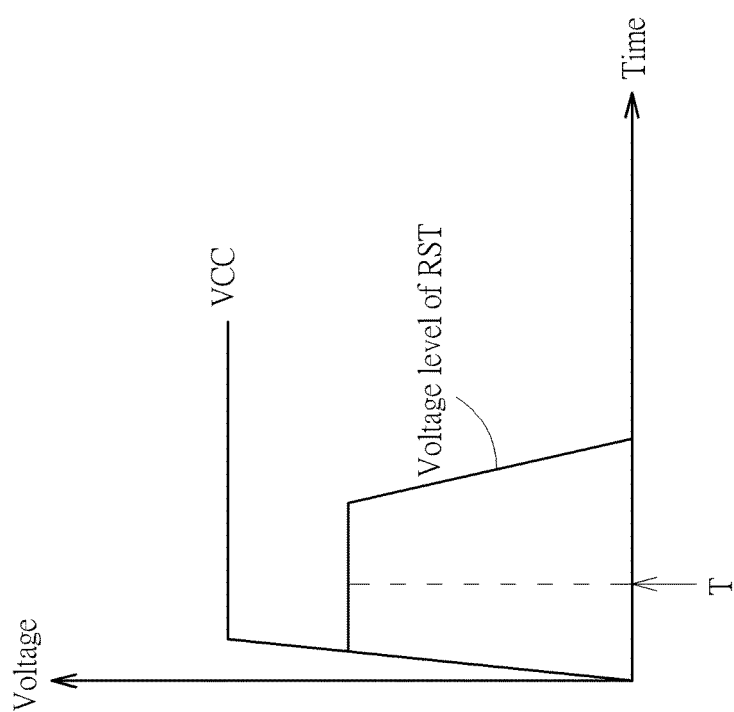

In another embodiment, the voltage source VCC of the integrated circuit device including the processing circuit 30C can be connected to the voltage source VCC of the external device 20. For example, please refer to FIG. 13. When the external device is powered on, voltage variations of the voltage source VCC and the reset end RST can be shown in FIG. 13. At a predetermined time point T, the voltage detection component 1102 detects a high voltage level at the reset end RST and accordingly generates the selection signal SEL with a high voltage level to the multiplexer 304 and the switching unit 308 according to the detected voltage level of the reset end RST. As shown in FIG. 13, the voltage level of the reset end RST falls in response to the discharging of the capacitor 204 and the predetermined time point T is set before the voltage level of the reset end RST falls.

Figure 14:
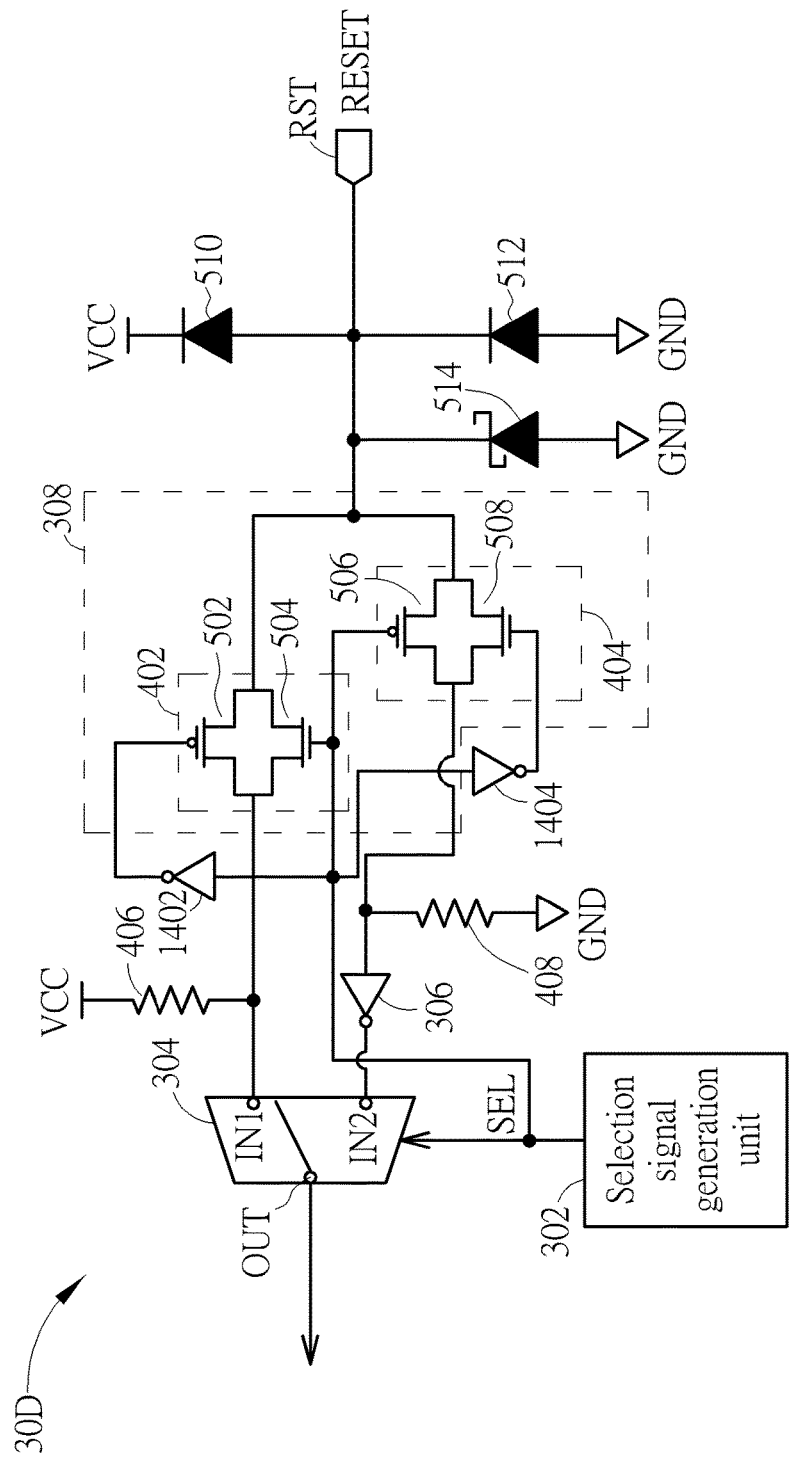
FIG. 14 is a schematic diagram illustrating a processing circuit according to an alternative embodiment of the present invention.

Please refer to FIG. 14, which is a schematic diagram illustrating a processing circuit 30D according to an alternative embodiment of the present invention. Please note that the units in the processing circuit 30D shown in FIG. 14 with the same designations as those in the processing circuit 30B shown in FIG. 5 have similar operations and functions. The interconnections of the same units can be referred from FIG. 14 and further description thereof is omitted for brevity. Compared with the processing circuit 30B shown in FIG. 5, the processing circuit 30D further includes inverters 1402 and 1404. As shown in FIG. 14, the inverter 1402 is connected between the transistor 502 and the selection signal generation unit 302. An input end of the inverter 1402 is coupled to the selection signal generation unit 302 for receiving the selection signal SEL. An output end of the inverter 1402 is coupled to the gate of transistor 502 of the first switch 402. The inverter 1404 is connected between the transistor 508 and the selection signal generation unit 302. An input end of the inverter 1404 is coupled to the selection signal generation unit 302 for receiving the selection signal SEL. An output end of the inverter 1404 is coupled to the gate of transistor 508 of the second switch 404. In an embodiment, when the external reset signal RESET is an active low reset signal, the selection signal SEL is at high voltage level, the transistors 502 and 504 are turned on and the transistors 506 and 508 are turned off. Compared with the processing circuit 30B shown in FIG. 5, the transistors 502 and 504 are turned on simultaneously, thus providing lower impedance.

Similarly, when the external reset signal RESET is an active high reset signal, the selection signal SEL is at low voltage level, the transistors 506 and 508 are turned on and the transistors 502 and 504 are turned off. Compared with the processing circuit 30B shown in FIG. 5, the transistors 506 and 508 are turned on simultaneously, thus providing lower impedance.

In the above embodiments, the output signal of the multiplexer 304 is an active low reset signal. In another embodiment, the output signal of the multiplexer 304 is an active high reset signal, one end of the resistor 406 is coupled to the ground end, and one end of the resistor 408 is coupled to the voltage source VCC. An active low external reset signal RESET will be transmitted to the input end of the inverter 306. An active high external reset signal RESET will be transmitted to the first input end IN1 of the multiplexer 304.

In summary, the processing circuit of the reset signal according to the present invention can be integrated into an integrated circuit device, so that the integrated circuit device can perform the reset procedure in response to an active high reset signal or an active low reset signal without additional external circuit components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A processing circuit of a reset signal, the processing circuit receiving the reset signal via a reset end, the processing circuit comprising:
   a multiplexer having an output end, a first input end and a second input end, for connecting the output end to the first input end or the second input end according to a selection signal;
   an inverter coupled to the second input end of the multiplexer; and
   a switching unit coupled to the reset end for receiving the reset signal and connecting the reset end to the first input end of the multiplexer or the inverter according to the selection signal.

2. The processing circuit of claim 1, wherein the selection signal is provided by a selection signal generation unit, and the selection signal generation unit comprises:
   a first resistor, comprising a first end and a second end, wherein the first end is coupled to a voltage source;
   a first transistor, comprising a first end coupled to the second end of the first resistor, a second end for receiving a control signal for turning on or off the first transistor, and a third end coupled to the multiplexer and the switching unit for providing the section signal; and
   an electrical contact connected to the third end of the first transistor, wherein the electrical contact is connected to a ground end or floating.

3. The processing circuit of claim 2, wherein the electrical contact is a bonding pad or a pin.

4. The processing circuit of claim 1, wherein the selection signal is provided by a selection signal generation unit, and the selection signal generation unit comprises:
   a resistor connected to a voltage source; and
   a fuse, wherein one end of the fuse is connected to the multiplexer and the switching unit and the other end of the fuse is selectively connected to the resistor or a ground end.

5. The processing circuit of claim 1, wherein the selection signal is provided by a selection signal generation unit, and the selection signal generation unit comprises:
   a voltage detection component coupled to the reset end, the multiplexer and the switching unit for detecting a voltage level of the reset end and generating the selection signal according to the voltage level of the reset end.

6. The processing circuit of claim 1, wherein the switching unit comprises:
   a first switch coupled between the reset end and the first input end of the multiplexer; and
   a second switch coupled between the reset end and an input end of the inverter.

7. The processing circuit of claim 6, wherein the first switch is a CMOS transmission gate or an NMOS transistor.

8. The processing circuit of claim 7, wherein the CMOS transmission gate comprises:

a first PMOS transistor comprising a drain coupled to the reset end, a gate coupled to a voltage source, and a source coupled to the first end of the multiplexer; and a first NMOS transistor comprising a drain coupled to the reset end, a gate for receiving the selection signal, and a source coupled to the first end of the multiplexer.

9. The processing circuit of claim 7, wherein the processing circuit further comprises a first inverter, the first inverter receives the selection signal and the CMOS transmission gate comprises:

a second PMOS transistor comprising a drain coupled to the reset end, a gate coupled to an output end of the first inverter, and a source coupled to the first input end of the multiplexer; and a second NMOS transistor comprising a drain coupled to the reset end, a gate for receiving the selection signal, and a source coupled to the first input end of the multiplexer.

10. The processing circuit of claim 6, wherein the second switch is a CMOS transmission gate or a PMOS transistor.

11. The processing circuit of claim 10, wherein the CMOS transmission gate comprises:

a third PMOS transistor comprising a drain coupled to the reset end, a gate for receiving the selection signal, and a source coupled to an input end of the inverter; and a third NMOS transistor comprising a drain coupled to the reset end, a gate coupled to a ground end, and a source coupled to the input end of the inverter.

12. The processing circuit of claim 10, wherein the processing circuit further comprises a second inverter, the second inverter receives the selection signal and the CMOS transmission gate comprises:

a fourth PMOS transistor comprising a drain coupled to the reset end, a gate receiving the selection signal, and a source coupled to an input end of the inverter; and a fourth NMOS transistor comprising a drain coupled to the reset end, a gate coupled to an input end of the second inverter, and a source coupled to the input end of the inverter.

13. The processing circuit of claim 1, wherein the switching unit is a demultiplexer.

14. The processing circuit of claim 1, further comprising:

a first diode comprising a cathode coupled to a voltage source, and an anode coupled to the reset end; and a second diode comprising a cathode coupled to the reset end, and an anode coupled to a ground end.

15. The processing circuit of claim 1, further comprising:

a Schottky diode comprising a cathode coupled to the reset end, and an anode coupled to a ground end.

* * * * *